United States Patent
Romain-Latu et al.

(10) Patent No.: US 8,178,431 B2
(45) Date of Patent: May 15, 2012

(54) PROCESS FOR PRODUCING A PN HOMOJUNCTION IN A NANOSTRUCTURE

(75) Inventors: Eddy Romain-Latu, Grenoble (FR); Philippe Gilet, Têche (FR)

(73) Assignee: Commissariat a l'Energie Atomique, Paris (FR)

( * ) Notice: Subject to any disclaimer, the term of this patent is extended or adjusted under 35 U.S.C. 154(b) by 48 days.

(21) Appl. No.: 12/691,925

(22) Filed: Jan. 22, 2010

(65) Prior Publication Data

US 2010/0193766 A1 Aug. 5, 2010

(30) Foreign Application Priority Data

Jan. 22, 2009 (FR) ...................................... 09 00270

(51) Int. Cl.
*H01L 21/22* (2006.01)
*H01L 29/861* (2006.01)

(52) U.S. Cl. ... 438/542; 257/14; 257/200; 257/E21.135; 257/E29.327; 257/9; 977/762; 977/932

(58) Field of Classification Search .................. 257/9, 14, 257/200, E21.135, E29.327
See application file for complete search history.

(56) References Cited

U.S. PATENT DOCUMENTS

2006/0006463 A1  1/2006 Islam et al.
2006/0134883 A1  6/2006 Hantschel et al.

FOREIGN PATENT DOCUMENTS

WO    WO 2004/088755 A1    10/2004

OTHER PUBLICATIONS

Latu-Romain, E. et al., *A Generic Approach for Vertical Integration of Nanowires*, Nanotechnology, vol. 19, 2008, pp. 1-6.
Latu-Romain, E. et al., *Optical and Electrical Characterization of Vertically Integrated ZnO Nanowires*, Microelectronics Journal, vol. 40, 2009, pp. 224-228.
France Preliminary Search Report for FA 720770 / FR 0900270 dated Sep. 25, 2009.

*Primary Examiner* — Long Pham
(74) *Attorney, Agent, or Firm* — Alston & Bird LLP (57) ABSTRACT

The invention relates to a process for producing a p-n junction in a nanostructure, in which the nanostructure has one or more nanoconstituents made of a semiconductor material with a single type of doping having one conductivity type, characterized in that it includes a step consisting in forming a dielectric element (3, 32, ..., 3n) embedding the nanostructure over a height h, the dielectric element generating a surface potential capable of inverting the conductivity type over a defined width W of the nanoconstituents(s) thus embedded over the height h.

12 Claims, 2 Drawing Sheets

Plane geometry:
$$\Phi(x) = \Phi_s \left(1 - \frac{x}{W}\right)^2$$

Fig. 8

PROCESS FOR PRODUCING A PN HOMOJUNCTION IN A NANOSTRUCTURE

BACKGROUND OF THE INVENTION

The invention relates to the field of optoelectronics and in particular to semiconductor radiation emitters and to photoreceivers.

Most optoelectronic devices based on semiconductors have p-n junctions integrated into their active parts.

This is for example the case with LEDs (light-emitting diodes). Thus, at the contact of two, type n and type p, semiconductors, the charge carriers of each type combine in the active zone, emitting photons. The active zone is often composed of one or more quantum wells which provide a high luminescence efficiency and enable the emission wavelength to be adjusted, by controlling their composition and their thickness.

N-type or p-type semiconductors may be obtained by intrinsic doping, conventionally by stoichiometric defects.

N-type and p-type semiconductors may also be obtained by extrinsic dopants that are introduced into the matrix, either during growth of the materials or after their growth, by a technique such as diffusion or ion implantation. However, it should be noted that, during growth on a heterosubstrate, there is diffusion of the light atoms from the substrate (aluminium atoms in the case of an $Al_2O_3$ substrate) and therefore extrinsic doping, but there are often stoichiometric defects (for example oxygen vacancies), and therefore also intrinsic doping.

Thus, document WO 2004/088755 may be cited, which describes a nanostructure of the nanowire type incorporating p-n junctions. In one of the embodiments described, a nanowire is formed on a substrate and then two layers of a polymer material are deposited in succession on the substrate. The first polymer layer has a given concentration of dopants of a first type (for example, donors), the second layer comprising dopants of a second type (acceptors). The structure then undergoes a suitable heat treatment so as to allow the dopants to diffuse from each of the two layers into two successive portions of the nanowire. This makes it possible to create a p-n junction between the two portions.

Thus, the above document describes so-called extrinsic doping techniques in which more precisely a first doping of a first type and a second doping of a second type are carried out.

Throughout the present Application, it should be understood that "extrinsic doping" of a matrix means doping carried out by dopants differing in nature from said matrix that are introduced into said matrix during the growth or come from another material.

These semiconductor doping techniques have certain drawbacks.

To be specific, although extrinsic doping is for the present time well understood and controlled in certain semiconductors, such as for example silicon (Si) or gallium arsenide (GaAs), this is not the case for other semiconductors, such as gallium nitride (GaN) or zinc oxide (ZnO). In the latter case, the doping is sometimes difficult or requires heat treatment or else complex processes. For example, techniques for the p-type doping of ZnO have not yet been developed. In addition, for certain semiconductors, doping is sometimes unstable, or even impossible.

To alleviate these drawbacks, processes have therefore been proposed for producing a p-n junction in a nanostructure using a single type of doping.

These processes are based on a structure having a metal layer surrounded by dielectric layers in order to avoid electric charge transfer to the outside of the metal layer, the p-n junction of the nanostructure being produced by biasing the metal layer. Typically, such a structure is of the transistor type that can be produced with a gate, the bias of which modifies the type of conductivity of the channel beneath said gate, and is then in an on-state or an off-state depending on the gate bias.

However, the structure is relatively complicated insofar as it requires the deposition of at least three successive layers around the nanowire. Moreover, this process requires means for biasing the metal element so as to produce the p-n junction in the nanostructure.

SUMMARY OF THE INVENTION

One object of the invention is to provide a process for producing a p-n junction from a nanostructure having a single type of doping of a given conductivity type, which is greatly simplified compared with the existing processes and has the same advantages as the latter.

Another object of the invention is to provide a process for producing a nanostructure having at least one p-n junction produced according to the first process.

Yet another object of the invention is to provide a semiconductor device produced from a nanostructure obtained by the second process.

The invention relates to a process for producing a p-n junction in a nanostructure, in which the nanostructure has one or more nanoconstituents made of a semiconductor material with a single type of doping having one conductivity type, characterized in that it includes a step consisting in forming a dielectric element embedding the nanostructure over a height h, the dielectric element generating a surface potential capable of inverting the conductivity type over a defined width W of the nanoconstituents(s) thus embedded over the height h.

This process also comprises at least one of the following features, taken individually or in combination:
  the step of forming a dielectric element embedding the nanostructure is repeated several times over different portions of the nanostructure;
  the dielectric elements thus formed generate different surface potentials capable of inverting the conductivity type over different widths of the nanoconstituent(s) thus embedded from one portion of the nanostructure to another;
  prior to the step of forming the dielectric element, another dielectric element embedding the nanostructure is formed from a material not capable of inverting the conductivity type of the nanoconstituent(s) thus embedded;
  the height h satisfies the relationship $H-W \leq h \leq H$, where H is the height of the nanostructure and W is said defined width;
  in order to form the dielectric element, a material is chosen that generates a surface potential inverting the conductivity type over a width at least equal to the transverse half-dimension of the nanoconstituent(s) thus embedded;
  in order to form the dielectric element, a material is chosen that generates a surface potential inverting the conductivity type over a width (W) strictly less than the transverse half-dimension of the nanoconstituent(s) thus embedded;
  the dielectric element is formed on a nanostructure having at least one nanowire type nanoconstituent, the transverse dimension of which differs upon moving in its height direction, so that said dielectric element generates, on a first portion of the nanowire, a surface potential inverting the conductivity type of the nanowire over a width (W) strictly smaller than the transverse half-dimension of the nanowire and generates, on another portion of the nanowire, a surface potential inverting the conductivity type of the nanowire over a width at least equal to the transverse half-dimension of the nanowire;

the nanostructure has a plurality of nanoconstituents of the nanoparticle type; and the nanostructure has one or more nanoconstituents of the nanowire type.

The invention also relates to a process for producing a nanostructure with at least one p-n junction, in which the nanostructure has one or more nanoconstituents made of a material having a single type of extrinsic doping, characterized in that it further includes the following steps:

the formation of a dielectric element, embedding the nanostructure over a height h, made of a material generating a surface potential capable of inverting the conductivity type over a defined width W of the nanoconstituent(s) thus embedded over the height h; and the formation of metal contacts on either side of the nanostructure, each of the two contacts being matched to the local conductivity type of the nanostructure.

This process also includes at least one step consisting in forming, for a nanostructure having at least one nanoconstituent of the nanowire type, one of the metal contacts with a height at most equal to the difference between the height H of the nanowire and the height h of the dielectric element(s) embedding the nanowire.

The invention also relates to a semiconductor device characterized in that it comprises at least one nanostructure obtained by the process for producing said nanostructure according to the invention.

This device may furthermore include at least one of the following features:

the nanostructure has a plurality of nanoconstituents of the nanoparticle type, said nanoparticles being in contact with one another;

the dielectric element capable of inverting the conductivity type over a defined width of the nanoconstituent(s) is an organic material such as a polymer having conjugated n electrons and/or electrophilic groups, for example halogen groups;

the dielectric element is a polymer chosen from polystyrene or its derivatives, polynaphthalene or its derivatives and polypyrene or its derivatives; and the dielectric element capable of inverting the conductivity type over a defined width of the nanoconstituent(s) is an inorganic material, such as an oxide.

BRIEF DESCRIPTION OF THE SEVERAL VIEWS OF THE DRAWING(S)

The invention will be better understood and other objects, advantages and features thereof will become more clearly apparent on reading the following description, given in conjunction with the appended drawings in which.

DETAILED DESCRIPTION OF THE INVENTION

A nanostructure may generally be defined as a structure having one or more nanoconstituents, at least one dimension of the or of each nanoconstituent being of nanoscale size.

However, within the context of the invention, a nanostructure will have one or more nanoconstituents, each nanoconstituent having:

either two nanoscale dimensions, in which case it is then referred to as a nanowire;

or three nanoscale dimensions, in which it is then referred to as a nanoparticle.

Figure 1:
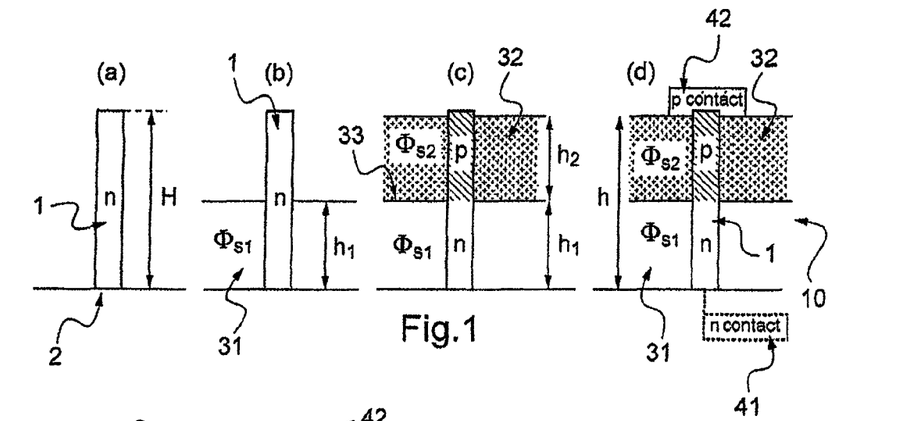
FIG. 1 comprises FIGS. 1(a) to 1(d) that show various steps in the fabrication of a semiconductor device according to the invention.

FIG. 1 shows for example a nanostructure formed from a single nanoconstituent of the nanowire type. The nanowire in question is of cylindrical shape and has a diameter D which typically ranges from a few tens of nanometres to a few hundred nanometres, whereas its height H is of the order of a micron.

Figure 7:
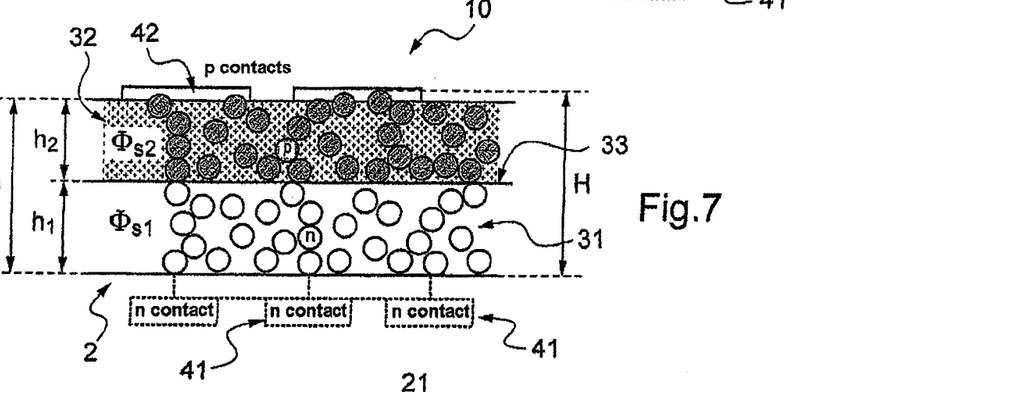

FIG. 7 shows a nanostructure formed from several nanoconstituents of the nanoparticle type. It should be noted that this type of nanostructure necessarily comprises a plurality of nanoparticles. A nanoparticle can be likened to a sphere, the typical diameter of which ranges from a few tens of nanometres to a few hundred nanometres.

The invention cannot be implemented for a structure having a single nanoscale dimension. This limitation will be explained in greater detail later in the description.

The semiconductor device 10 illustrated in FIG. 1 comprises a nanostructure 1 of the nanowire type which has, for example, been obtained by being grown on a substrate 2. For example, the nanowire is grown by MOCVD (metal-organic chemical vapour deposition).

The substrate 2 may be made of sapphire ($Al_2O_3$). It may also have a layer ranging from a few tens of nanometres to a few hundred nanometres in thickness, for example a layer of zinc oxide (ZnO), deposited on the bulk $Al_2O_3$ substrate. It may also be electrically conducting, depending on the application in question.

In general, the formation of a nanostructure by growth on a substrate has been widely described in the prior art.

In particular, the reader may refer to the document WO 2004/088755 mentioned above, which describes the formation of a nanowire by growth on a substrate. The reader may also refer to the article published in the journal Semiconductor Science and Technology, Vol. 20, pp. S22-S34, 2005, the authors of which are G. C. Yi, C. Wang and W. I. Park.

After the step of growing the nanostructure 1, it is doped with n-type (or p-type) charge carriers.

In practice, the nanostructure is generally doped during growth (by addition of a dopant to the precursor gas), but it may also be doped after growth by ion implantation or diffusion.

The steps described above are known per se, and their implementation results for example in the structure illustrated in FIG. 1(a), in the case of an n-doped nanowire.

During experimental trials, the Applicant proposed embedding a nanowire as shown in FIG. 1(a) with a dielectric element.

The nanowire 1 was embedded with a dielectric element of height h smaller than the height H of the nanowire.

As a result, the transverse upper face of the nanowire 1 is not embedded, thereby enabling in particular a metal contact to be subsequently deposited on the upper end of the nanowire.

Figures 2, 3, 4:
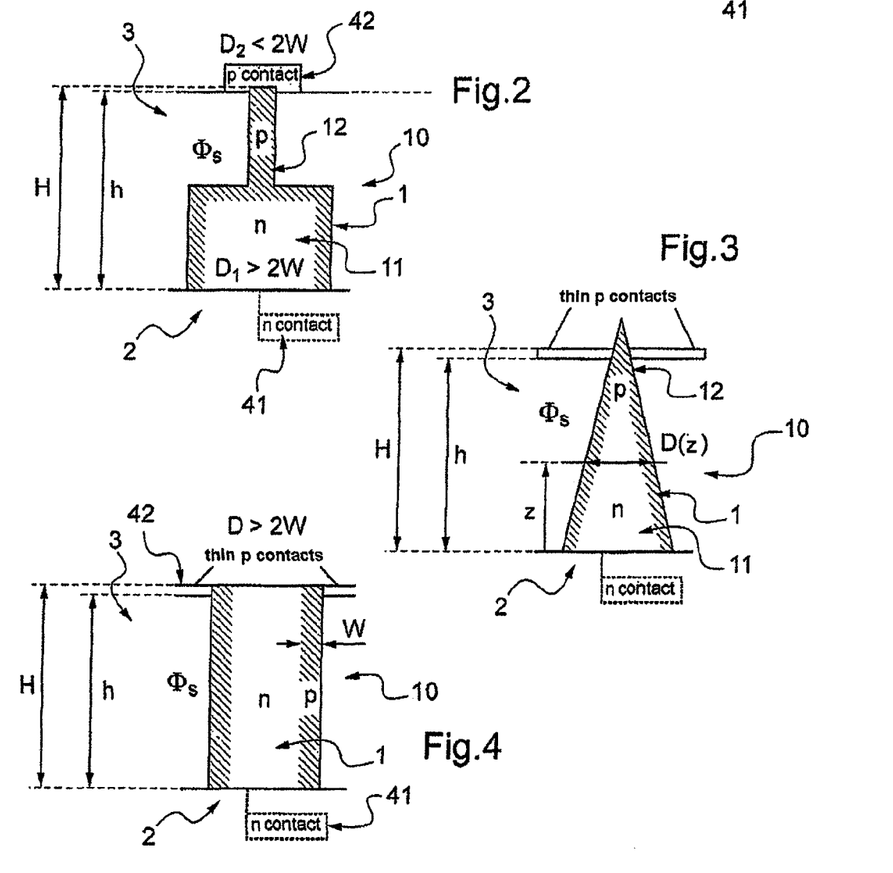
FIGS. 2 to 7 show, by way of non-limiting examples, various types of semiconductor device according to the invention.

The structure obtained after these steps is for example shown in FIG. 4.

The nanowire 1, having a cylindrical shape, has a transverse dimension that can be likened to a diameter D.

The nanowire 1 is made of zinc oxide (ZnO) and the dielectric element chosen is a polymer 3 of the novolac resin type, for example the polymer Accuflo T-27 from Honeywell.

After the step of forming the dielectric element, this structure was electrically characterized by techniques derived from atomic microscopy.

It was then observed that the polymer 3 generates a surface potential $\Phi_s=1.9$ eV resulting in an inversion of the conductivity type over a width W of the nanowire 1, taken along the transverse dimension of the nanowire. More precisely, an inversion of the conductivity type was observed over a width W of about 90 nm for which the conductivity is of the p-type. A p-n junction is therefore produced within the nanowire 1.

Moreover, by testing nanowires of different diameters, it was observed that the inversion width W remained constant, namely about 90 nm under the abovementioned experimental conditions.

Finally, it was observed that, for a nanowire diameter smaller than a threshold diameter, the inversion of the conductivity type took place over the entire diameter of the nanowire, this threshold diameter being of the order of twice the inversion width, namely in this case around 180 nm.

To obtain these experimental results, the SCM (scanning capacitance microscopy) and SSRM (scanning spread resistance microscopy) techniques were employed.

It should be noted that this p-n junction is obtained very simply, just with the presence of a dielectric element embedding the nanowire, as a single layer. The p-n junction obtained may be termed a permanent junction insofar as there is no need to bias a metal layer to produce the p-n junction.

The above experimentally illustrated principle may be generalized to any type of embedding material capable of forming a p-n junction inside the nanowire.

To do this, it is conceivable to use various types of organic materials.

For example, it is conceivable to use a polymer or copolymer, whether aromatic or not, possessing conjugated π electron systems, for example polystyrene ($C_6H_6$ aromatic ring) and derivatives thereof, polynaphthalene ($C_{10}H_8$ aromatic ring) and derivatives thereof, polypyrene ($C_{16}H_{10}$ aromatic ring) and derivatives thereof and/or electrophilic groups, for example halogen groups. These particularly electrophilic materials are well suited to generating a p-type inversion in the nanostructure, for example by hydrogenating the surface of the semiconductor.

However, the embedding material is not exclusively a polymer material.

Inorganic materials, such as oxides, for example $SiO_2$, may also be envisaged.

To summarize, the embedding material may be extended to any type of dielectric material generating, just by its presence, a suitable surface potential, i.e. one capable of inverting the conductivity type over a defined width of the nanostructure.

The above experimentally illustrated principle for a ZnO nanowire may also be generalized to any type of structure comprising a semiconductor material capable of forming a p-n junction.

For example, but not limitingly, the nanowire 1 may be made of gallium nitride (GaN), aluminium nitride (AlN), indium nitride (InN), cadmium sulphide (CdS), cadmium selenide (CdSe), cadmium telluride (CdTe), zinc sulphide (ZnS), zinc selenide (ZnSe), zinc telluride (ZnTe), copper gallium diselenide ($CuGaSe_2$), copper indium disulphide ($CuInS_2$) or copper indium diselenide ($CuInSe_2$).

The process according to the invention will now be described more precisely with reference to FIG. 1.

This process makes it possible to produce a p-n junction in a nanostructure and to produce a nanostructure with a p-n junction in order to form a semiconductor device.

The application in question is that of a nanostructure having at least one nanoconstituent of the nanowire 1 type.

As mentioned above, the nanowire 1 has a height H and, if it is of cylindrical shape, the transverse dimension of the nanowire 1 corresponds to the diameter D thereof.

After the nanowire has been produced, a first dielectric element 31 of height $h_1$ is formed in step (b), said dielectric element embedding the nanowire 1 over this height $h_1$ and being made of a material that generates a surface potential $\Phi_{s1}$ not capable of inverting the type of conductivity of the nanowire thus embedded.

The height of the first dielectric element 31 may for example correspond to the half-height of the nanowire.

Step (b) may be carried out by spin coating.

Where appropriate, an etching sub-step may be carried out in order for the height $h_1$ of the deposition of the first dielectric element 31 to be precisely controlled and for the uncoated surface of the nanowire 1 to be cleaned.

Next, in step (c), the first dielectric element 31 is coated with a second dielectric element 32 of height $h_2$. The second dielectric element 32 thus embeds the nanowire 1 over this height $h_2$, made of a material generating a surface potential $\Phi_{s2}$ capable of inverting the conductivity type over the entire transverse dimension of the nanowire.

The second dielectric element 32 and the first dielectric element 31 are in direct contact with each other. The contact zone between the two dielectric elements 31, 32 has the reference 33.

The second dielectric element 32 embeds the cylindrical nanowire over its entire perimeter. As a result, it will be understood that it is sufficient to have a material capable of inverting the conductivity type over a transverse half-dimension of the nanowire 1 in order finally to invert the conductivity type over the entire transverse dimension of the nanowire.

This is due to the symmetry of revolution of the nanowire 1 about its axis of the symmetry.

The transverse half-dimension thus corresponds to the half-diameter (or radius) of the nanowire 1.

This means that the width W of the nanowire, taken along the transverse dimension of said nanowire, over which the conductivity type has been inverted corresponds, as a minimum, to the radius of the nanowire 1.

The total height $h=h_1+h_2$ of the dielectric elements 31, 32 embedding the nanowire 1 is less than the height H of the nanowire 1. This allows a metal contact 42 to be subsequently deposited on the nanowire 1.

To do this, step (c), carried out for example by spin coating, may be followed by a chemical-mechanical polishing step.

Moreover, the total height h is also greater than the quantity H−W so that the contacted end is well within the inversion regime, without the metal contact being in contact with the inversion zone.

The conditions over the total height h do not prejudice the creation of a p-n junction within the nanowire.

The spin coating consists in dispensing a dielectric in sol-gel form onto the nanostructure and then in rotating the nanostructure so as to spread the dielectric over the nanostructure, over a controlled height, and finally in carrying out an annealing operation in order to evaporate the solvents and to form the solid dielectric. Sol-gel processes are based on the polymerization of dissolved molecular precursors and allow glassy materials to be produced without involving a melting operation.

The chemical-mechanical polishing allows the height $h_2$ of the dielectric element 32 to be controlled. It should be noted that the dielectric element 32 and the nanowire 1 are polished at the same time, but since their respective hardnesses are different, the result is a different topography.

Finally, after the step (c), a p-n junction has thus been produced in the nanowire 1, the interface (also called the junction plane) of which lies perpendicular to the axis of the nanowire 1: the p-n junction is called an axial p-n junction.

The axial p-n junction is produced just by the presence of the dielectric material 32 around the nanowire 1, which permanently induces an inversion of the conductivity type in the nanowire 1.

Finally, step (d) of depositing metal contacts 41, 42 on either side of the nanowire is carried out, each of the two contacts being matched to the local conductivity type of the nanowire, namely p-type or n-type.

After step (d), a semiconductor device with a nanostructure of the nanowire 1 type that includes a p-n junction has therefore been produced.

Step (b) serves merely to apply an electrical insulation around the p-n junction to be produced, but this step is not essential for forming the p-n junction itself.

Moreover, depending on the envisaged nanostructure, it is conceivable to dispense with step (b).

FIG. 2 shows for example a nanostructure for which step (b) is unnecessary.

The application in question is that of a nanowire having two different portions 11, 12 with different transverse dimensions.

The height of the nanowire 1 is to denoted by H.

The two portions 11, 12 of the nanowire 1 in question are cylindrical and have a common axis of symmetry.

The transverse dimension of the first portion 11 may therefore be likened to a diameter, denoted by $D_1$. Consequently, the transverse half-dimension of the first portion 11 corresponds to the radius of this portion 11.

The transverse dimension of the second portion 12 may also be likened to a diameter, denoted by $D_2$. Consequently, the transverse half-dimension of the second portion 12 corresponds to the radius of this portion 12.

To produce a p-n junction in the nanowire of FIG. 2, step (c) is thus carried out.

More precisely, step (c) then consists in forming a dielectric element 3 of height h, embedding the nanowire 1 over this height h, made of a material generating a surface potential $\Phi_s$ capable both of:

inverting the conductivity type over a width (W) strictly smaller than the transverse half-dimension of the first portion 11 of the nanowire 1 (i.e. $W<D_1/2$); and inverting the conductivity type over at least a transverse half-dimension of the second portion 12 of the nanowire 1 (i.e. $W>D_2/2$).

It will be understood that this result may be obtained by judiciously choosing the dielectric material 3 and/or the transverse dimensions $D_1$, $D_2$ of the two portions 11, 12 of the nanowire 1.

For example, for a nanowire made of zinc oxide (ZnO), it is possible to choose $D_1$=50 nm and $D_2$=150 nm with a dielectric material 3 as a polymer of the novolac resin type, for example the polymer Accuflo T-27 from Honeywell.

The height h of the dielectric element is such that it is greater than the quantity H−W so that the end intended to receive a contact is definitely in the inversion regime.

Here again, step (c), for example carried out by spin coating, may be followed by a chemical-mechanical polishing step in order to ensure that height h of the dielectric element 3 is less than the height H of the nanowire 1.

A metal contact can then be deposited in the inversion zone.

Finally, a semiconductor device linked with a nanowire having a p-n junction is obtained by carrying out a step (d) of depositing the metal contacts in a similar way as that presented in FIG. 1(d).

The p-n junction obtained is axial insofar as a portion of the interface of the junction extends perpendicular to the axis of the nanowire 1. The p-n junction obtained is also radial insofar as another portion of the interface of the junction extends parallel to the axis of the nanowire 1. Since the p-n junction obtained is both axial and radial, it is referred to as a hybrid or mixed p-n junction.

This type of p-n junction makes it possible to improve the electric injection and transport of electrons in the p-type portion in order to compensate for a lower density of charge carriers, i.e. holes, in this portion.

The mixed p-n junction is thus produced by just the presence of the dielectric material 3 around the nanowire 1, which induces, just by its presence, a permanent inversion of the conductivity type in the nanowire 1.

FIG. 3 illustrates another embodiment of the invention.

The invention in question also relates to a nanowire 1 of conical shape.

The nanowire 1 thus has a shape such that its transverse dimension D flows continuously over the height of the nanowire 1.

Unlike the nanowire shown in FIG. 2, the nanowire 1 illustrated in FIG. 3 therefore does not have two different portions each having constant transverse dimensions $D_1$, $D_2$.

Since the nanowire is of conical shape, a cross section in a plane perpendicular to the axis of symmetry of the cone has a circular shape.

Thus, if z represents an axial point along the axis of symmetry of the nanowire 1, the transverse dimension of the nanowire 1 at this axial point, taken in such a plane section, is defined by $D=D(z)$ where $0 \leq z \leq H$. It will therefore be understood that this transverse dimension is taken along an axis perpendicular to the axis of symmetry of the nanowire 1.

Consequently, the transverse half-dimension of the nanowire 1 where an axial point z corresponds to the radius of the nanowire 1 at this axial point.

The steps for producing the nanostructure illustrated in FIG. 3 are similar to those of the nanostructure illustrated in FIG. 2.

To produce a p-n junction in the nanowire 1 of FIG. 3, step (c) is thus carried out.

More precisely, step (c) consists here in forming a dielectric element 3 of height h, embedding the nanowire 1 over this height h, made of a material generating a surface potential $\Phi_s$ capable both of:

inverting the conductivity type over a width (W) strictly smaller than the transverse half-dimension over a first portion of the nanowire 1; and inverting the conductivity type over the entire transverse dimension over a second portion of the nanowire 1.

Two portions 11, 12 may therefore be clearly distinguished, one (the portion 11) having the two conductivity types, p and n, and the other (the portion 12) having only a single conductivity type, here p.

The height h of the dielectric element 3 is less than the height H of the nanowire 1. The height h is also greater than the quantity H−W.

The conical shape ensures that there is a small transverse dimension at one end of the nanowire 1 and consequently the existence of a portion of a single conductivity type (the portion 12) irrespective of the nature of the embedding material 3.

A chemical-mechanical polishing step may also be carried out.

Finally, a semiconductor device produced with a nanowire 1 having a p-n junction is obtained by carrying out a step (d) of depositing the metal contacts similar to those of the embodiments illustrated in FIGS. 1 and 2.

The p-n junction thus produced is particularly advantageous for improving light extraction, for example in the case of the production of an LED.

There again, the p-n junction is produced just by the presence of the dielectric material 3 around the nanowire 1, which induces, just by its presence, a permanent inversion of the conductivity type in the nanowire 1.

FIG. 4 also illustrates an embodiment for which step (b) of FIG. 1 is unnecessary.

The application in question is that of a cylindrical nanowire 1, thus having a transverse dimension that is constant over its entire height.

The transverse dimension therefore corresponds to the diameter D of the cylinder formed by the nanowire 1.

The transverse half-dimension therefore corresponds to the radius of the nanowire 1.

The implementation of step (c) results in a p-n junction in a nanowire 1 similar to that of the first portion 11 of the nanowire 1 illustrated in FIG. 2.

More precisely, step (c) consists here in inverting the conductivity type over a width (W) strictly smaller than the transverse half-dimension of the nanowire 1 (i.e. W<D/2) over the entire height of said nanowire.

Here again, step (c), carried out for example by spin coating, may be followed by a chemical-mechanical polishing step in order to ensure that the height h of the dielectric element 3 is lower than the height h of the nanowire 1. Moreover, the height h is here also greater than the quantity H−W.

Finally, to produce the semiconductor device with a nanowire having a p-n junction, step (d) is carried out.

The p-n junction may be termed a radial junction if the interface between the p and n zones extends parallel to the axis of symmetry of the nanowire.

This nanostructure makes it possible in particular to increase the area for recombination of the charge carriers of each type, the interface between the two, p and n, zones being relatively large, and consequently to increase the quantum efficiency of the nanostructure, photon emission being greater.

The metal contacts deposited in this step (d) differ however from those intended for the p-n junctions of FIGS. 1 to 3.

This is because the metal contact 42 intended for the p zone (or n zone respectively) of the p-n junction must be annular and thin so as not to be in contact with the n zone (or p zone respectively) of the p-n junction of the nanowire 1.

Its shape and its height must therefore be precisely controlled.

In addition, it is preferable to carry out the chemical-mechanical polishing step so as to make step (d) easier.

This is because it is necessary for the surface on which the contact is deposited to be as uniform as possible, otherwise the deposition of a thin film of well controlled height, in order to form the metal contact, is unlikely to lead to the desired result.

The radial p-n junction is produced just by the presence of the dielectric material 3 around the nanowire 1, which induces, just by its presence, a permanent inversion of the conductivity type in the nanowire 1.

Figure 5:
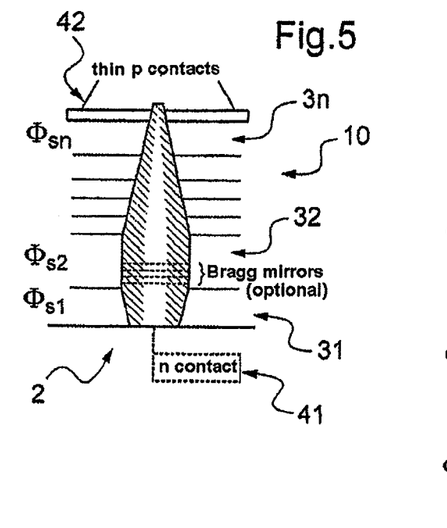

FIG. 5 illustrates an embodiment of the invention similar to that illustrated in FIG. 4.

The application in question is that of a nanowire 1 with an axisymmetric shape, having a transverse dimension D that varies continuously as a function of its height.

Unlike the embodiment illustrated in FIG. 3, the shape however is not conical.

Indeed, a large variety of shapes will be obtained by varying the growth parameters while the nanowire is being grown, as explained by Z. L. Wang in Materials Today, 26 Jun. 2004 in the case of a ZnO nanowire.

If z represents an axial point along the axis of symmetry of the nanowire 1, the transverse dimension of the nanowire 1 at this axial point z is then defined in a plane perpendicular to this axis of symmetry, such as the diameter of the nanowire at this axial point.

The transverse dimension is therefore written as D=D(z) or $0 \leq z \leq H$. Therefore, the transverse half-dimension of the nanowire 1 at the axial point z corresponds to the radius of the nanowire 1 at this axial point.

In this embodiment, steps (c) and (d) of the embodiment shown in FIG. 4 are repeated.

However, step (c) is repeated here n times one after another, with n dielectric elements 31, 32, . . . , 3n each embedding the nanowire 1 over a different portion thereof and generating a surface potential $\Phi_{s1}$, $\Phi_{s2}$, . . . , $\Phi_{sn}$ differing respectively from one another.

Step (c) then consists in carrying out the following substeps:

during a sub-step ($c_1$), a first dielectric element 31 is formed, embedding the nanowire over a first height $h_1$, made of a material generating a surface potential $\Phi_{s1}$ capable of inverting the conductivity type of the nanowire over a first defined width $W_1$ along the transverse dimension of the nanowire;

during a sub-step ($c_2$), a second dielectric element 32 is formed, embedding a different portion of the nanowire 1 from that embedded by the first dielectric element 31, over a height $h_2$ of the nanowire, made of a material generating a surface potential $\Phi_{s2}$ capable of inverting the conductivity type of the nanowire thus embedded over a second defined width $W_2$ along the transverse dimension of the nanowire; etc.;

during a sub-step ($c_n$), an nth dielectric element 3n is formed, embedding an nth portion of the nanowire 1, over a height $h_n$ of the nanowire, made of a material generating a surface potential $\Phi_{sn}$ capable of inverting the conductivity type of the nanowire thus embedded over an nth defined width $W_n$ along the transverse dimension of the nanowire.

After sub-step ($c_n$) and before step (d), a chemical-mechanical polishing step may be carried out on the embedding material 3n.

The total height $h=h_1+h_2+ \ldots +h_n$ of the n embedding materials 31, 32, . . . , 3n is smaller than the height H of the nanowire but greater than the quantity H−W, where W represents the inversion width $W_n$ for the purpose of subsequently depositing the metal contact.

Finally, to produce the semiconductor device with a nanowire having a p-n junction, step (d) is similar to that resulting in the semiconductor device illustrated in FIG. 4.

The p-n junction may be termed a radial junction if the interface between the p zone and the n zone lies parallel to the axis of symmetry of the nanowire.

The nanostructure shown in FIG. 5 allows the electrical injection and transport properties and the optical properties in the nanostructure to be adjusted so as to improve the quantum efficiency (photon emission) and the photon extraction.

In addition, for some applications, a step for producing Bragg mirrors may be provided, preferably during step (a).

Once again, the p-n junction is produced just by the presence of the dielectric material 3 around the nanowire 1, which induces, just by its presence, a permanent inversion of the conductivity type in the nanowire 1.

Figure 6:
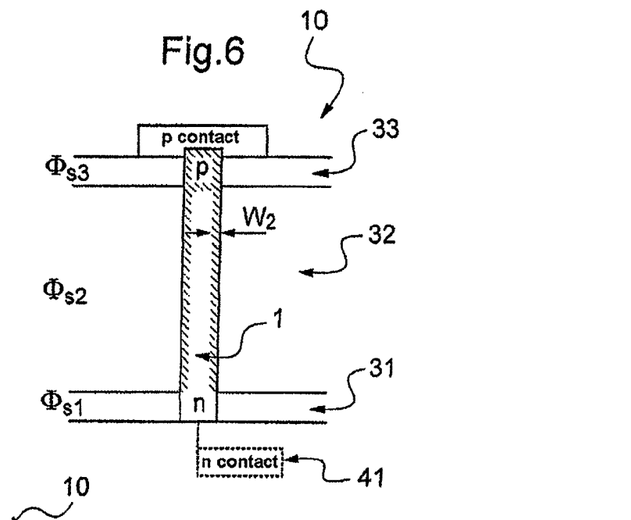

FIG. 6 illustrates an embodiment of the invention which is also similar to that illustrated in FIG. 4.

The application in question is that of a nanowire 1 of cylindrical shape, having a transverse dimension to be likened with a diameter D.

In this embodiment, steps (c) and (d) of the embodiment shown in FIG. 4 are repeated.

However, step (c) is repeated here three times one after another, with three dielectric elements 31, 32, 33 each embedding the nanowire 1 over a different portion thereof and generating a surface potential $\Phi_{s1}$, $\Phi_{s2}$, $\Phi_{s3}$ differing respectively from one another.

Step (c) then consists in carrying out the following sub-steps:

during a sub-step ($c_1$), a first dielectric element 31 is formed, embedding the nanowire over a first height $h_1$ and made of a material not capable of inverting the conductivity type of the nanowire;

during a sub-step ($c_2$), a second dielectric element 32 is formed, embedding a portion of the nanowire 1 different from that embedded by the first dielectric element 31, over a height $h_2$ of the nanowire, made of a material generating a surface potential $\Phi_{s2}$ capable of inverting the conductivity type of the nanowire thus embedded over a defined width $W_2$ along the transverse dimension of the nanowire; and during a sub-step ($c_3$), a third dielectric element 33 is formed, embedding a third portion of the nanowire, over a height $h_3$ of the nanowire, made of a material generating a surface potential $\Phi_{s3}$ capable of inverting the conductivity type of the nanowire thus embedded over the entire transverse dimension of the nanowire.

After sub-step ($c_3$) and before step (d), a chemical-mechanical polishing step may be carried out on the embedding material 33.

The total height $h=h_1+h_2+h_3$ of the three embedding materials 31, 32, 33 is less than the height H of the nanowire but greater than the quantity H−W, where W represents the inversion width $W_3$.

Finally, to produce the semiconductor device with a nanowire having a p-n junction, step (d) is similar to that resulting in the semiconductor device illustrated in FIG. 4.

The nanostructure shown in FIG. 6 allows a good injection of the charge carriers into the n and p zones respectively and provides a large recombination zone defined by the p-n interface.

Once again, the p-n junction is produced just by the presence of dielectric materials 32, 33 around the nanowire 1, which induce, just by their presence, a permanent inversion of the conductivity type in the nanowire 1.

In all the embodiments described above, a nanostructure has been shown that has a single nanowire-type nanoconstituent.

A person skilled in the art will understand that the steps carried out to produce a single nanowire may be implemented to produce a nanostructure comprising a plurality of nanowires based alongside one another.

In this case, steps (c), (d) and optionally (b) are applied at the same time to this plurality of nanowires.

FIG. 7 illustrates another embodiment of the invention, in which the nanostructure does not have one or more nanoconstituents of the nanowire type, but a plurality of nanoconstituents of the nanoparticle type.

Each nanoparticle may be likened to a sphere of diameter D. The transverse dimension of a nanoparticle may therefore be defined by its diameter D. Consequently, the transverse half-dimension of this nanoparticle may be likened to the radius of the nanoparticle.

More precisely, the nanostructure is formed from a plurality of nanoconstituents of the nanoparticle type, having quantum confinement properties.

The term "quantum confinement" is understood to mean that the displacement of the electrons or holes is limited in at least one direction. This property is linked to the size of the nanoparticles in comparison with the Bohr radius.

The nanoparticles are in contact with one another, so as to ensure electrical contact. The nanoparticles together define a nanostructure of height denoted by H.

These nanoparticles may be formed by various processes. Specifically, it is conceivable to use a process derived from the PLD (pulsed laser deposition) process, a laser pyrolysis process or chemical methods (see M. L. Kahn et al., Adv. Func. Mater. 2005, 15, 458).

The process for producing a p-n junction in such a nanostructure and the process for producing a semiconductor device associated with this nanostructure repeat steps (b), (c) and (d) illustrated in FIG. 1.

More precisely, during a step (b), a first dielectric element 31 of height $h_1$ is formed, embedding the plurality of nanoparticles over a first portion of the nanostructure of height $h_1$, made of a material generating a surface potential $\Phi_{s1}$ not capable of inverting the conductivity type of the nanoparticles lying within this first portion.

Next, during a step (c), the first dielectric element 31 is coated with a second dielectric element 32 of height $h_2$. The second dielectric element 32 thus embeds a second portion of the nanostructure over this height $h_2$, made of a material generating a surface potential $\Phi_{s2}$ capable of inverting the conductivity type over the entire transverse dimension of the nanoparticles lying within this second portion.

The inversion of the conductivity type in the nanowire 1 is permanent and obtained just by the presence of the dielectric element embedding the nanoparticles.

The two portions of the nanostructure are in direct contact with each other in a contact plane 33.

The total height $h=h_1+h_2$ of the dielectric elements 31, 32, is smaller than the height H of the nanostructure but greater than the quantity H−W, for the purpose of depositing the metal contact. Certain nanoparticles therefore partly extend beyond the portions of the nanostructure that are embedded by the dielectric elements 31, 32. This enables at least one metal contact 42 to be subsequently deposited on the nanostructure.

To ensure electrical continuity, it is therefore sufficient for there to be a contact between:
the p-type contact 42;
a few p-type nanoparticles;
a few n-type nanoparticles; and
the n-type contact 41.

Step (c) may for example be carried out by spin coating and may be followed by a chemical-mechanical polishing step.

After this step (c), a p-n junction has therefore been produced in the nanostructure.

Finally, a step (d) similar to that illustrated in FIG. 2 is carried out to produce the semiconductor device.

As already mentioned, the processes presented cannot be implemented for a structure having a single nanoscale dimension.

In other words, these processes may apply only to nanostructures having one or more nanoconstituents with at least two nanoscale dimensions.

Figure 8:
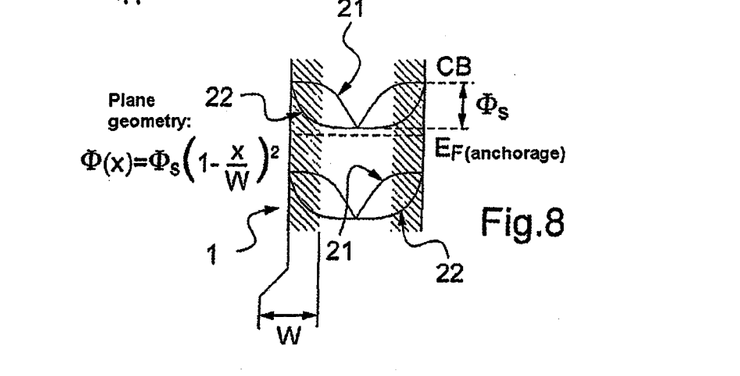
FIG. 8 shows the curve of the energy bands caused in a nanowire because of the presence of an embedding material generating a surface potential $\Phi_s$.

To better understand this condition, FIG. 8 shows a theoretical calculation providing the variation in the potential 21 along a transverse dimension (diameter D) of a nanowire 1 to which a surface potential $\Phi_s$ is applied.

The potential within the nanowire 1 decreases very slowly over a width W of the nanowire, this width being defined along the transverse direction of the nanowire (W<D). This width W corresponds to the nanowire width over which an inversion of the conductivity type is observed.

In this FIG. 8, the variation of the potential 22, again along a transverse dimension, of a plane structure has been added, to which structure a surface potential $\Phi_s$ is also applied. This type of structure has only a single nanoscale dimension.

It may be seen here that the potential decreases very rapidly upon penetrating the interior of the plane structure. The width over which an inversion of the conductivity type is observed is therefore very small, this width being defined by the direction of the transverse dimension of the plane structure.

More precisely, it may be shown that the width over which the conductivity type is inverted is 8 to 10 times larger for a nanowire than for a plane structure, all other things being equal.

For this reason, an inversion of the conductivity type according to the invention on a plane structure cannot be easily envisaged because the conductivity type inversion width will be too small to allow a p-n junction to be produced within the very structure.

In contrast, the nanostructures considered within the context of the invention do allow such a junction to be produced. In addition, the choice of a suitable embedding dielectric material and/or, depending on the embodiment, the choice of a suitable transverse dimension of the nanoconstituent make(s) it possible to determine the nanoconstituent width over which it is desired to invert the conductivity type.

Another way of defining the application condition of the invention is to specify that the invention can be implemented only for nanostructures having one or more nanoconstituents with a high surface/volume ratio.

To give an order of magnitude, a surface/volume ratio may be considered to be high when it exceeds a threshold value of $10^6 \, m^{-1}$.

With a plane structure, it will be understood that the surface/volume ratio may be termed low.

We have presented several embodiments of the invention, for all of which we have defined a nanostructure height, a nanoconstituent transverse dimension and an inversion width over which the conductivity type of this nanoconstituent has been inverted.

In all cases, the inversion width W is a dimension extending along the transverse dimension of the nanoconstituent in question.

The invention claimed is:

1. Process for producing a p-n junction in a nanostructure, in which the nanostructure has one or more nanoconstituents having at least two nanoscale dimensions and made of a semiconductor material with a single type of doping having one conductivity type, characterized in that it includes a step consisting in forming a dielectric element (3, 32, ..., 3n) embedding the nanostructure over a height h, the dielectric element generating a surface potential capable of inverting the conductivity type over a defined width W of the nanoconstituents(s) thus embedded over the height h.

2. Process for producing a p-n junction in a nanostructure according to claim 1, in which the step of forming a dielectric element embedding the nanostructure is repeated several times over different portions of the nanostructure.

3. Process for producing a p-n junction according to the claim 2, in which the dielectric elements thus formed (31, 32, ..., 3n) generate different surface potentials ($\Phi_{s1}$, $\Phi_{s2}$, ..., $\Phi_{sn}$) capable of inverting the conductivity type over different widths of the nanoconstituent(s) thus embedded from one portion of the nanostructure to another.

4. Process for producing a p-n junction in a nanostructure according to claim 1, in which, prior to the step of forming the dielectric element, another dielectric element embedding the nanostructure is formed from a material not capable of inverting the conductivity type of the nanoconstituent(s) thus embedded.

5. Process for producing a p-n junction in a nanostructure according to claim 1, in which the height h satisfies the relationship $H-W \leq h \leq H$, where H is the height of the nanostructure and W is said defined width.

6. Process for producing a p-n junction in a nanostructure according to claim 1, in which, in order to form the dielectric element, a material is chosen that generates a surface potential inverting the conductivity type over a width at least equal to the transverse half-dimension of the nanoconstituent(s) thus embedded.

7. Process for producing a p-n junction in a nanostructure according to claim 1, in which, in order to form the dielectric element, a material is chosen that generates a surface potential inverting the conductivity type over a width (W) strictly less than the transverse half-dimension of the nanoconstituent(s) thus embedded.

8. Process for producing a p-n junction in a nanostructure according to claim 1, in which, the dielectric element is formed on a nanostructure having at least one nanowire type nanoconstituent, the transverse dimension of which differs upon moving in its height direction, so that said dielectric element generates, on a first portion of the nanowire, a surface potential inverting the conductivity type of the nanowire over a width (W) strictly smaller than the transverse half-dimension of the nanowire and generates, on another portion of the nanowire, a surface potential inverting the conductivity type of the nanowire over a width at least equal to the transverse half-dimension of the nanowire.

9. Process for producing a p-n junction in a nanostructure according to claim 1, in which the nanostructure has a plurality of nanoconstituents of the nanoparticle type.

10. Process for producing a p-n junction in a nanostructure according to claim 1, in which the nanostructure has one or more nanoconstituents of the nanowire type.

11. Process for producing a nanostructure with at least one p-n junction, in which the nanostructure has one or more nanoconstituents made of a material having a single type of extrinsic doping, characterized in that it further includes the following steps:

the formation of a dielectric element (3, 32, ..., 3n), embedding the nanostructure (1) over a height h, made of a material generating a surface potential capable of inverting the conductivity type over a defined width W of the nanoconstituent(s) thus embedded over the height h; and the formation of metal contacts on either side of the nanostructure, each of the two contacts being matched to the local conductivity type of the nanostructure.

12. Process for producing a nanostructure with at least one p-n junction according to claim 11, which further includes a step consisting, for a nanostructure having at least one nano-constituent of the nanowire type, in forming one of the metal contacts with a height at most equal to the difference between the height H of the nanowire and the height h of the dielectric element(s) embedding the nanowire.

\* \* \* \* \*